(12) United States Patent
Sreenilayam

(10) Patent No.: US 12,154,891 B2
(45) Date of Patent: Nov. 26, 2024

(54) PRINTED CIRCUIT BOARD WITH SINGLE RANK MEMORY CONFIGURATION USING PARTIALLY ALIGNED MEMORY CIRCUITS

(71) Applicant: GM Cruise Holdings LLC, San Francisco, CA (US)

(72) Inventor: Ajith Sreenilayam, Fremont, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 278 days.

(21) Appl. No.: 17/856,372

(22) Filed: Jul. 1, 2022

(65) Prior Publication Data

US 2024/0006387 A1    Jan. 4, 2024

(51) Int. Cl.
| | |
|---|---|
| *H05K 1/18* | (2006.01) |
| *H01L 23/00* | (2006.01) |
| *H01L 25/10* | (2006.01) |
| *B60W 60/00* | (2020.01) |

(52) U.S. Cl.
CPC ............ *H01L 25/105* (2013.01); *H01L 24/16* (2013.01); *H05K 1/181* (2013.01); *B60W 60/001* (2020.02); *H01L 2224/16225* (2013.01); *H05K 2201/10159* (2013.01); *H05K 2201/10545* (2013.01); *H05K 2201/10734* (2013.01)

(58) Field of Classification Search
CPC .............. H05K 1/18; H05K 1/181–187; H01L 23/5383; H01L 23/5386; H01L 23/50; G11C 11/409; G11C 11/4074; G11C 11/4076; B60W 30/00; B60W 60/00

USPC ................ 361/760, 764, 784, 790, 795, 803
See application file for complete search history.

(56) References Cited

U.S. PATENT DOCUMENTS

| | | | | |
|---|---|---|---|---|
| 5,941,447 | A * | 8/1999 | Chu ........................ | G11C 8/12 361/811 |
| 6,765,800 | B2 * | 7/2004 | Haba ...................... | H05K 1/147 361/675 |
| 7,224,595 | B2 * | 5/2007 | Dreps ...................... | G11C 5/04 361/728 |
| 7,392,338 | B2 * | 6/2008 | Rajan ..................... | G11C 5/147 711/110 |
| 7,414,312 | B2 * | 8/2008 | Nguyen ................... | G11C 8/12 257/E23.141 |
| 9,704,559 | B2 * | 7/2017 | Hayashi .................. | G11C 7/10 |
| 2019/0121560 | A1 * | 4/2019 | Keeth ................... | G06F 3/0673 |
| 2019/0251848 | A1 * | 8/2019 | Sivanesan ............... | H04W 4/08 |
| 2020/0393571 | A1 * | 12/2020 | Park ....................... | G01S 19/47 |
| 2021/0343325 | A1 * | 11/2021 | Moon .................. | G11C 11/4076 |

* cited by examiner

*Primary Examiner* — Tuan T Dinh
(74) *Attorney, Agent, or Firm* — Michael DiCato

(57) ABSTRACT

The subject technology is related to autonomous vehicles (AV) and, in particular, to an autonomous driver system controller (ADSC) that is fixed to the AV. The AV comprises an electronic drivetrain configured to move the AV; and an autonomous driver system controller (ADSC) fixed to an interior surface of the AV and configured to control the electronic drivetrain with a processor connected to a plurality of memory integrated circuits (IC) that are fixed to a printed circuit board (PCB). The plurality of memory ICs are mounted on each side of the PCB using a ball grid array (BGA) with a column of pins in the BGA of a top-surface memory IC is longitudinally aligned with a corresponding column of pins in the BGA of a bottom-surface memory IC.

2 Claims, 11 Drawing Sheets

PRINTED CIRCUIT BOARD WITH SINGLE RANK MEMORY CONFIGURATION USING PARTIALLY ALIGNED MEMORY CIRCUITS

TECHNICAL FIELD

The subject technology is related to autonomous vehicles and, in particular, to a printed circuit board with single rank memory configuration using partially aligned memory circuits.

BACKGROUND

Autonomous vehicles are vehicles having computers and control systems that perform driving and navigation tasks that are conventionally performed by a human driver. As autonomous vehicle technologies continue to advance, ride-sharing services will increasingly utilize autonomous vehicles to improve service efficiency and safety. However, autonomous vehicles will be required to perform many of the functions that are conventionally performed by human drivers, such as avoiding dangerous or difficult routes, and performing other navigation and routing tasks necessary to provide safe and efficient transportation. Such tasks may require the collection and processing of large quantities of data disposed on the autonomous vehicle.

BRIEF DESCRIPTION OF THE DRAWINGS

The embodiments herein may be better understood by referring to the following description in conjunction with the accompanying drawings in which like reference numerals indicate identically or functionally similar elements, of which.

DETAILED DESCRIPTION

Figure 1:
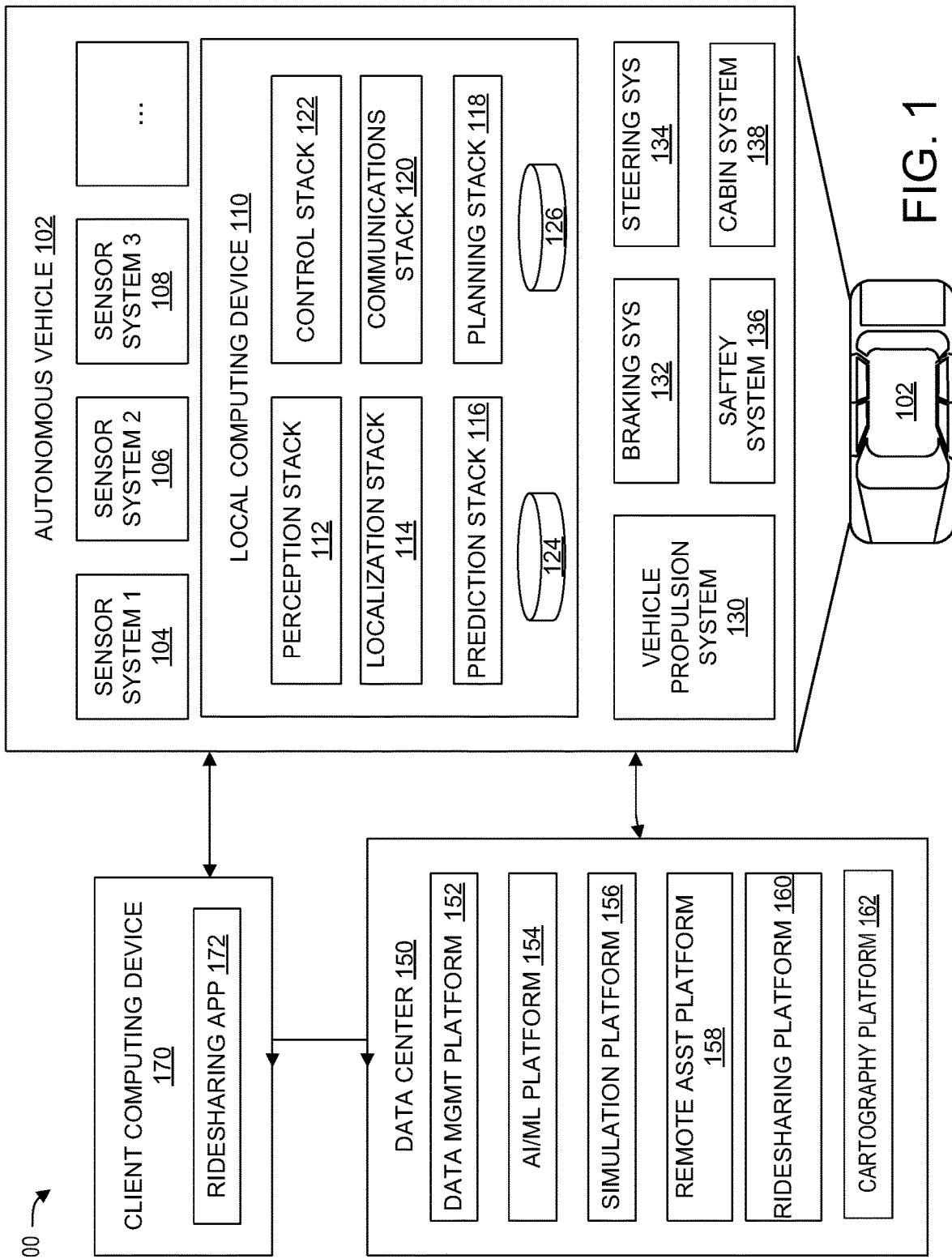
FIG. 1 illustrates an example of an autonomous vehicle (AV) management system according to an example of the instant disclosure.

The detailed description set forth below is intended as a description of various configurations of embodiments and is not intended to represent the only configurations in which the subject matter of this disclosure can be practiced. The appended drawings are incorporated herein and constitute a part of the detailed description. The detailed description includes specific details for the purpose of providing a more thorough understanding of the subject matter of this disclosure. However, it will be clear and apparent that the subject matter of this disclosure is not limited to the specific details set forth herein and may be practiced without these details. In some instances, structures and components are shown in block diagram form in order to avoid obscuring the concepts of the subject matter of this disclosure.

An autonomous vehicle (AV) includes a control system that controls various functions that are conventionally performed by a human driver, such as perception of objects in the environment, tracking of object movement in the environment, planning the movement of the AV based on object movement, and controlling navigation functions of the AV (e.g., acceleration, braking, turning, etc.). The AV may include a centralized controller or a distributed controller, which may be referred to as an autonomous driver system controller (ADSC) to perform various tasks such as acceleration, braking, planning, detection, and so forth. The ADSC may record data such as images, video feeds, light detection and ranging (LIDAR) sensor data regarding objects in an environment, audio, and so forth that can be used to improve AV operations.

The ADSC includes a processor and a memory for handling various aspects of the AV operation including object detection, prediction, route planning, and other functions that require significant power and memory consumption. It is common to use double data rate (DDR) memory modules, such as dual inline memory modules (DIMMs) that are mounted to a printed circuit board (PCB) that connect to a processor through an inline memory socket. This allows the DIMMS to be stacked and reduces real estate consumption of memory by mounting the DIMMs perpendicular to the PCB. For example, an 8 GB DIMM may include 32 memory integrated circuits (ICs) that can individually store 256 MB.

In some aspects, an AV may operate over unpredictable and rough terrain and may endure a significant amount of shock and vibration. A DIMM cannot accommodate the necessary shock and vibration and may temporarily become electrically disconnected, which can cause issues such as noise or even cause the non-volatile memory to be erased. An AV has a shock and vibration requirement and DIMM memory modules cannot satisfy the shock and vibration requirements and the memory can be mounted to a PCB of the AV. For example, memory must be integrated onto the PCB by a suitable manufacturing process such as soldering memory ICs to a ball grid array (BGA) package. Because a significant amount of memory and memory bandwidth may be needed for the processor, the memory ICs can consume significant PCB real estate, which limits the placement and routing of other electrical lines (e.g., electrical traces).

For example, in a single rank configuration, memory ICs are placed on a single planar surface and are separately addressed for each channel. The downside to this configuration is that the memory ICs must be placed on a single surface. Another configuration for memory ICs is a dual rank configuration that stacks the memory ICs on opposing sides of the PCB and improves memory density. In the dual rank configuration, the memory ICs on opposing surfaces share the same addressing lines and therefore only one memory IC can be addressed at a single time. As a result, a dual rank configuration halves memory bandwidth as compared to a single rank configuration. This way in dual rank configuration, we will get double the memory size than that of a single rank configuration. So, for a given memory size (for example: 128 GB=32 GB×4 channel) we need only half the channels (128 GB=16 GB×8 channel). So the drawback for using the dual rank is bandwidth will be half since we are using half of the available channels for a given memory size.

In some aspects, a single rank configuration may be preferable because the AV may need to load large datasets into memory, such as a three-dimensional (3D) point cloud map generated for the AV. For example, the AV includes an operational stack that operates different logical stacks (e.g., functions, or intervals) at different times to navigate the world with low latency and high accuracy. Examples of an AV planning stack include a perception stack for consuming sensor data from different sources, an identification interval stack for identifying objects within that sensor data, a prediction stack for predicting a path of an object in the scene, and a planning stack for planning movement of the AV based on the objects in the environment and their predicted path. Loading the different datasets from the memory during the correct interval is important because the processor may need the data at a specific time and failing to load the data may delay latency-sensitive computations that are directly related to AV safety.

The disclosed technology is related to stacking memory modules in a single rank configuration on opposing surfaces by offsetting memory modules and aligning a portion of pins of a memory IC to share common voltage references. In this case, the memory modules can be partially overlapped and do not require the addressing and data lines of the memory module to be electrically connected in a dual rank configuration. This configuration saves physical space on the PCB and improves the layout of other devices that connect to the processor.

Figure 2:
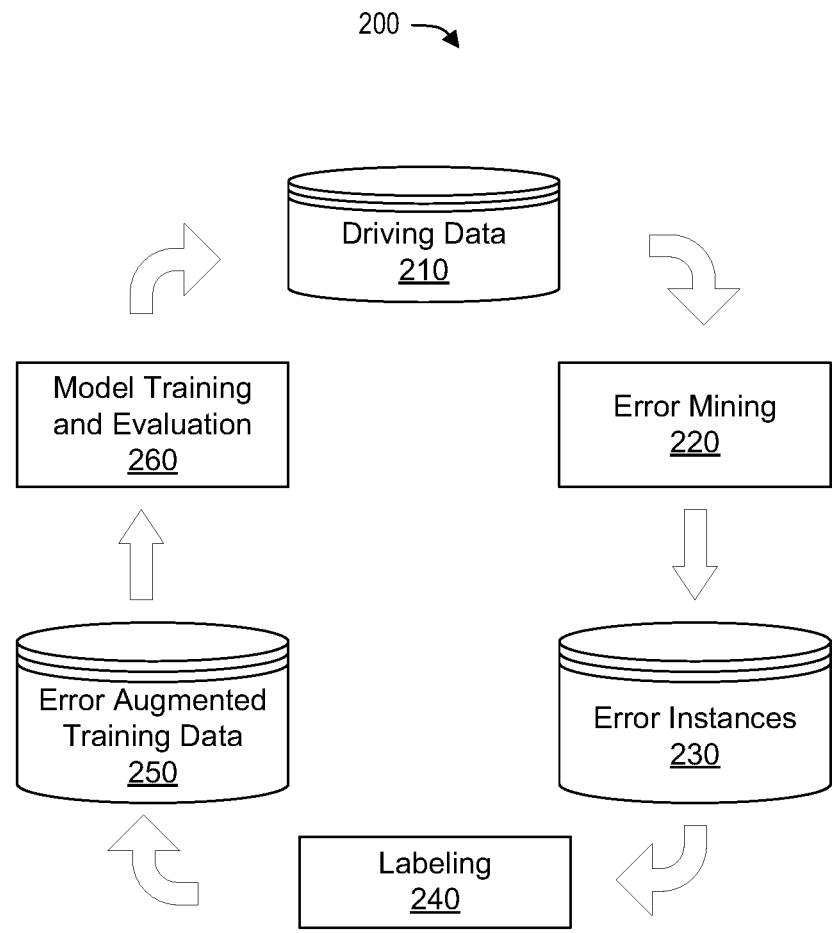
FIG. 2 illustrates an example diagram of a Continuous Learning Machine (CLM) for resolving uncommon scenarios in an AV according to an example of the instant disclosure.
Figure 3A:
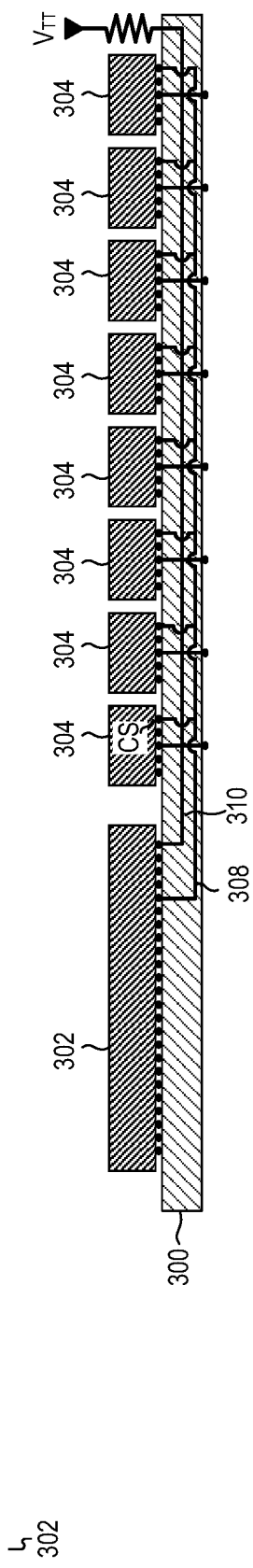
FIG. 3A illustrates a cross-section of an example printed circuit board (PCB) configured with memory integrated circuits (ICs) in a single rank configuration in accordance with some aspects.
Figure 3B:
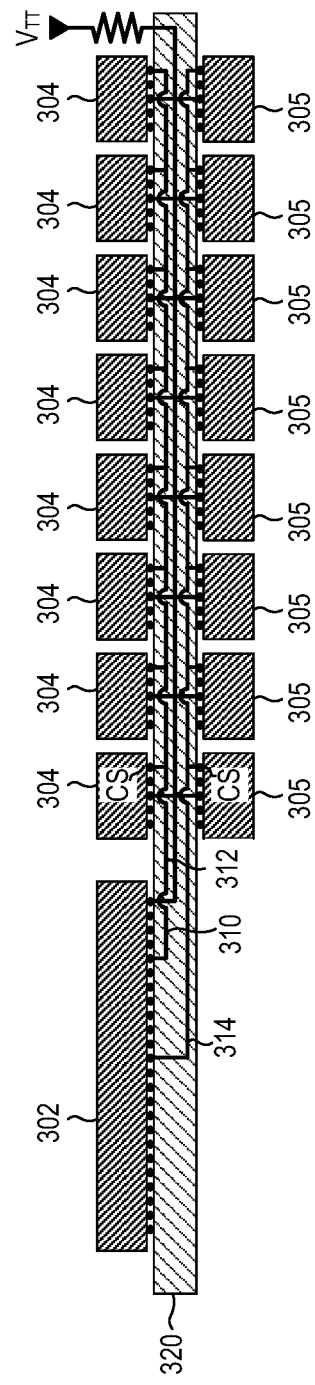
FIG. 3B illustrates another cross-section of an example PCB configured with memory ICs in a dual rank configuration in accordance with some aspects.
Figure 3C:
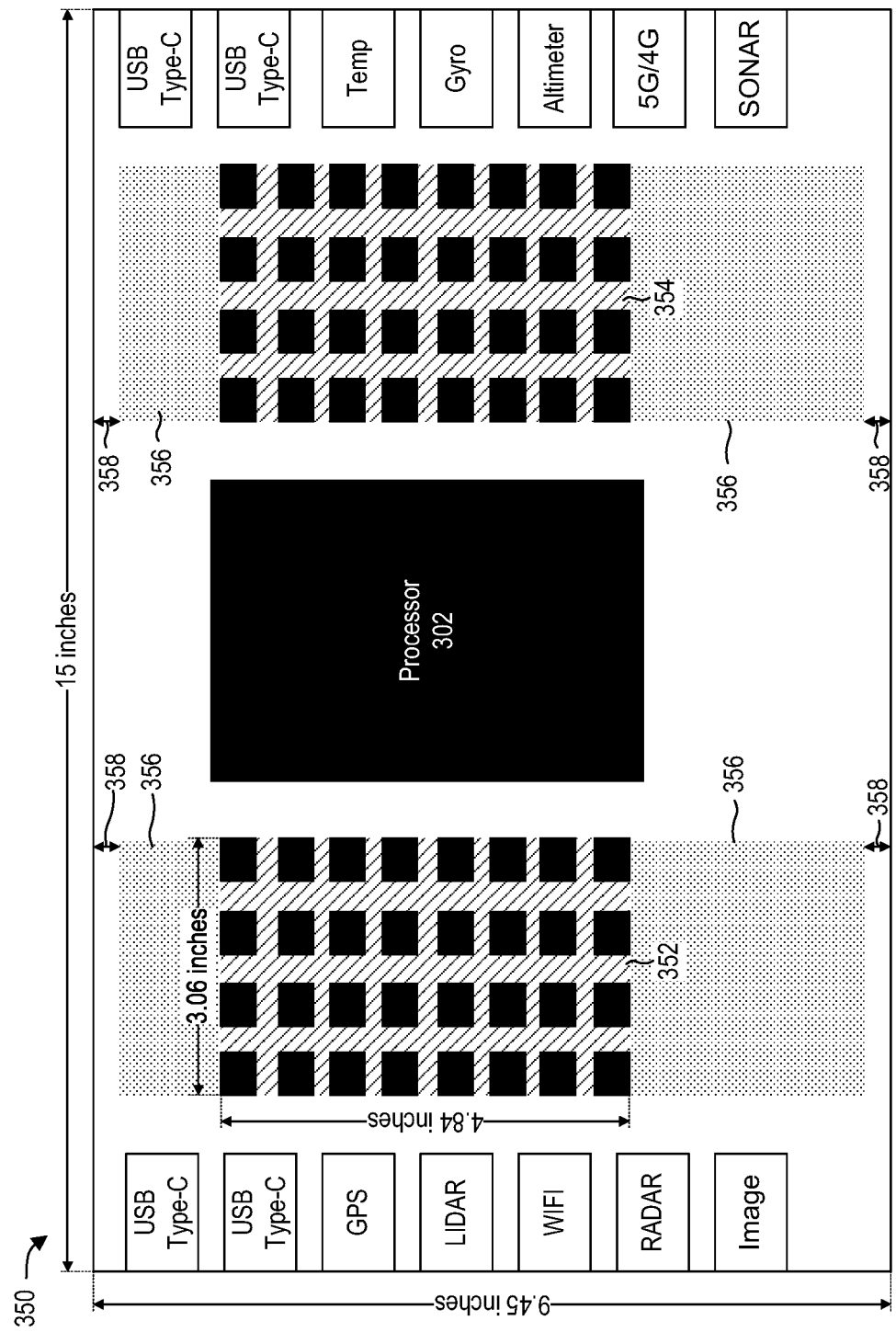
FIG. 3C illustrates a top view of PCB and memory configured in a single rank configuration on a top surface of the PCB in accordance with some aspects.
Figure 4:
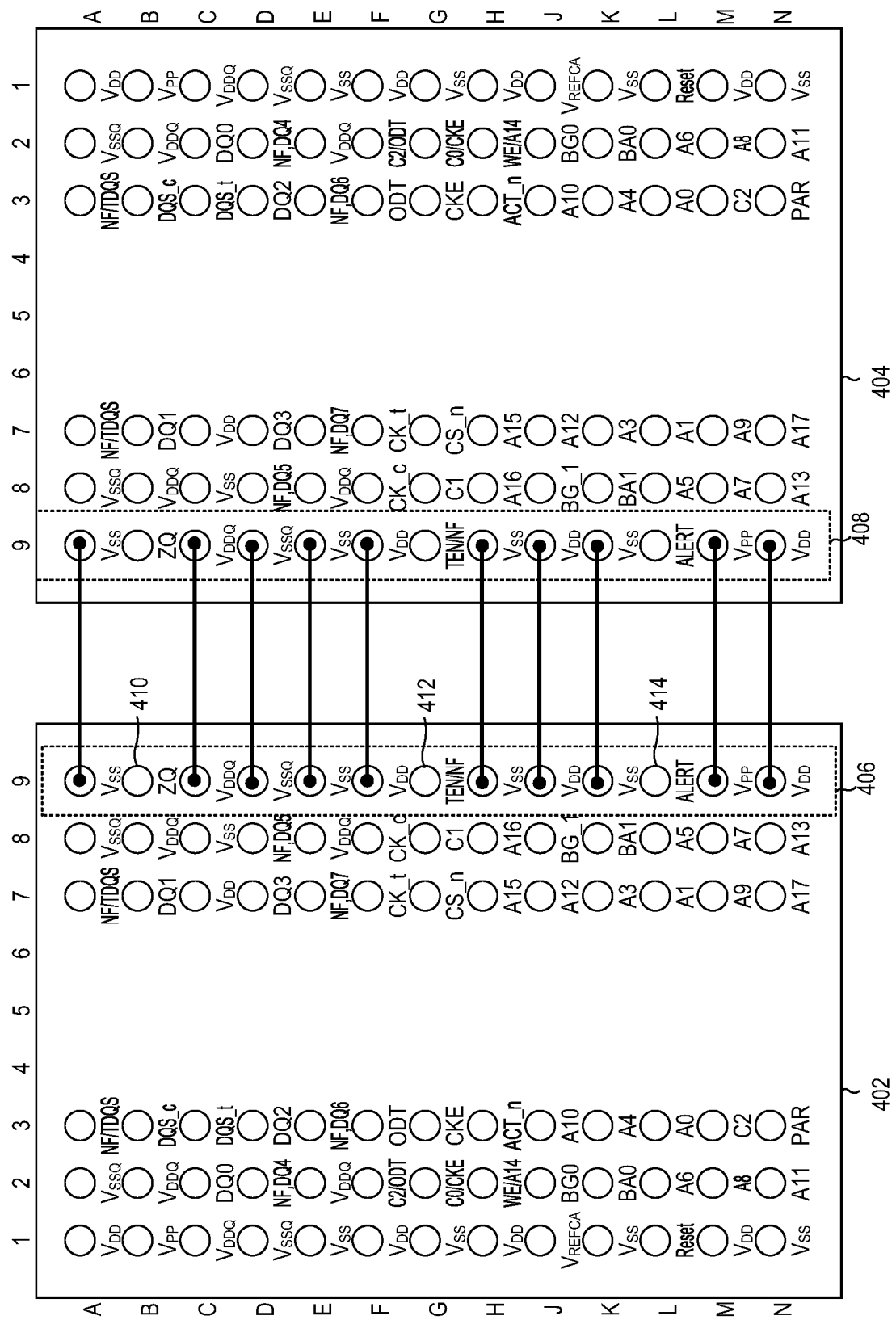
FIG. 4 illustrates a conceptual diagram of pin connections of a memory IC that is packaged in a ball grid array (BGA) package in accordance with some aspects of the disclosure
Figure 5:
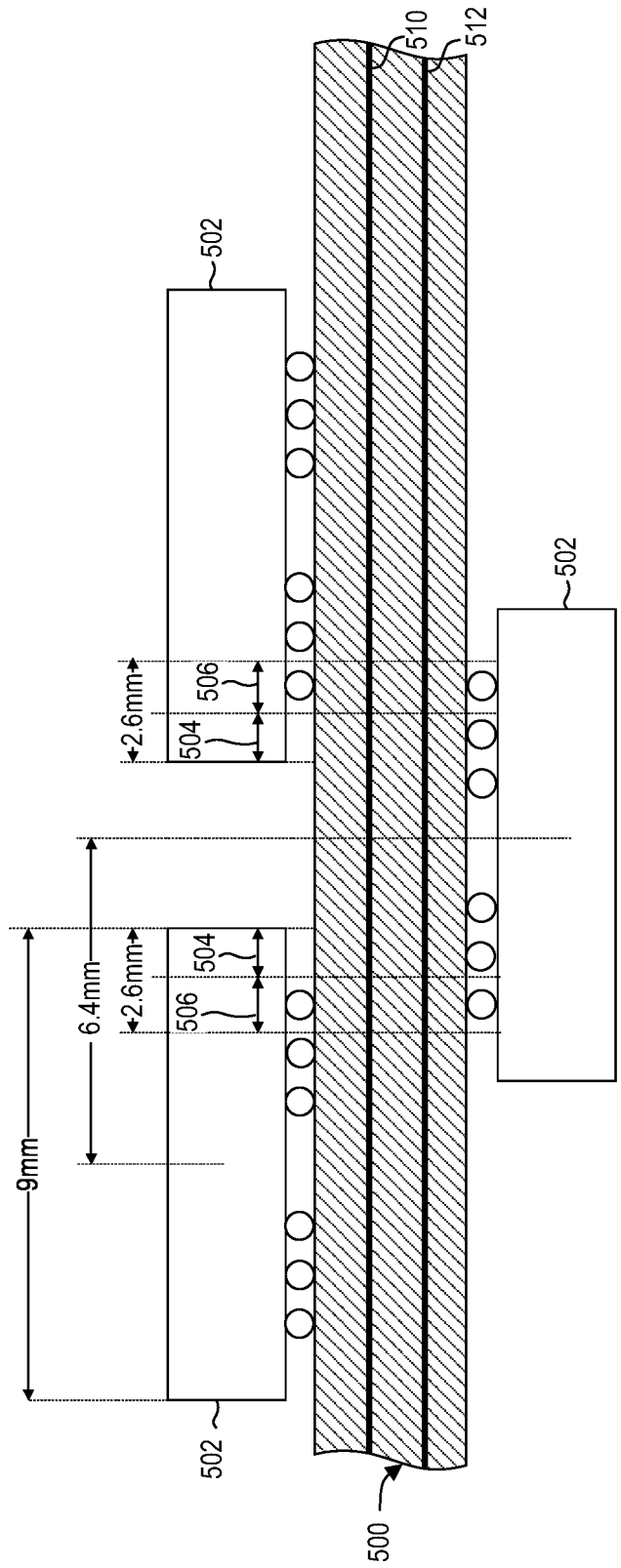
FIG. 5 illustrates a cross-section of a PCB including a plurality of memory ICs on opposing surfaces in a staggered configuration in accordance with some aspects of the disclosure
Figure 6:
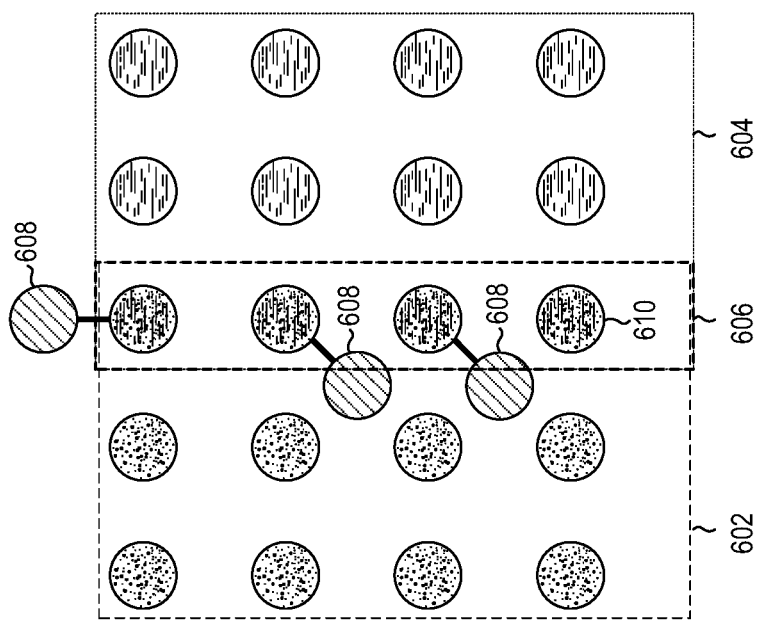
FIG. 6 is a conceptual diagram illustrating electrical pads on a top surface and a bottom surface of a PCB for electrically and mechanically coupling the memory IC to the PCB in accordance with some aspects of the disclosure.
Figure 7A:
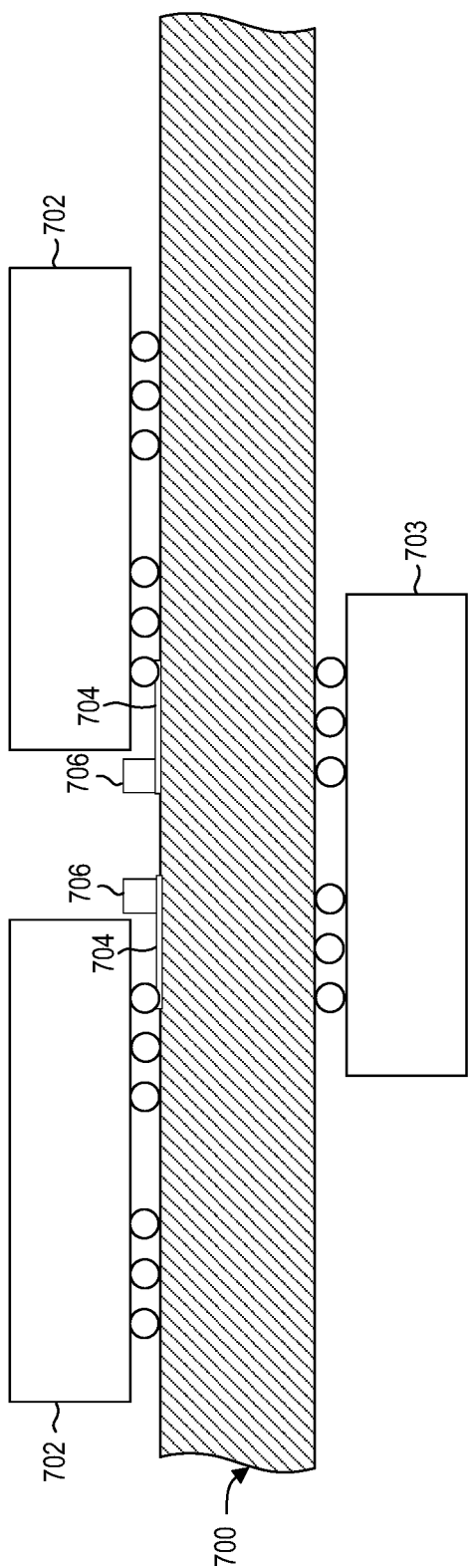
FIG. 7A illustrates a cross-section of a PCB with the staggered memory ICs and positioning of decoupling capacitors in accordance with some aspects of the disclosure.
Figure 7B:
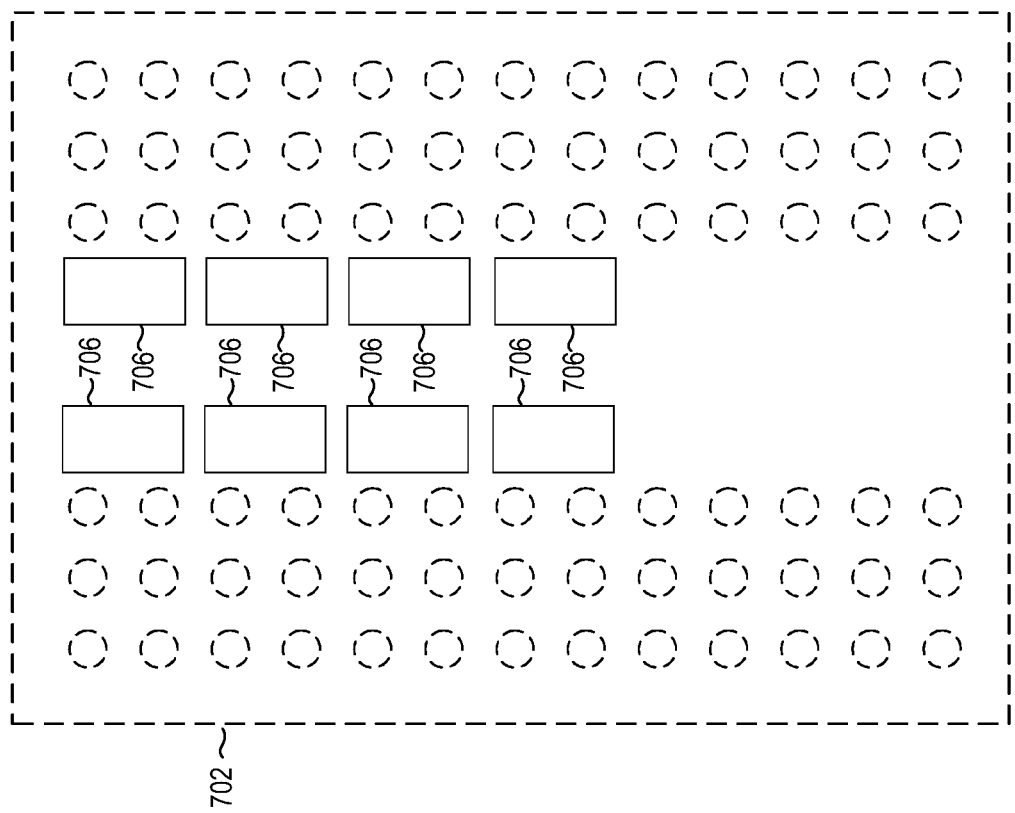
FIG. 7B illustrates a top-down perspective view of the PCB with a memory IC located on an opposing surface with respect to the capacitors 706 in accordance with some aspects of the disclosure.
Figure 8:
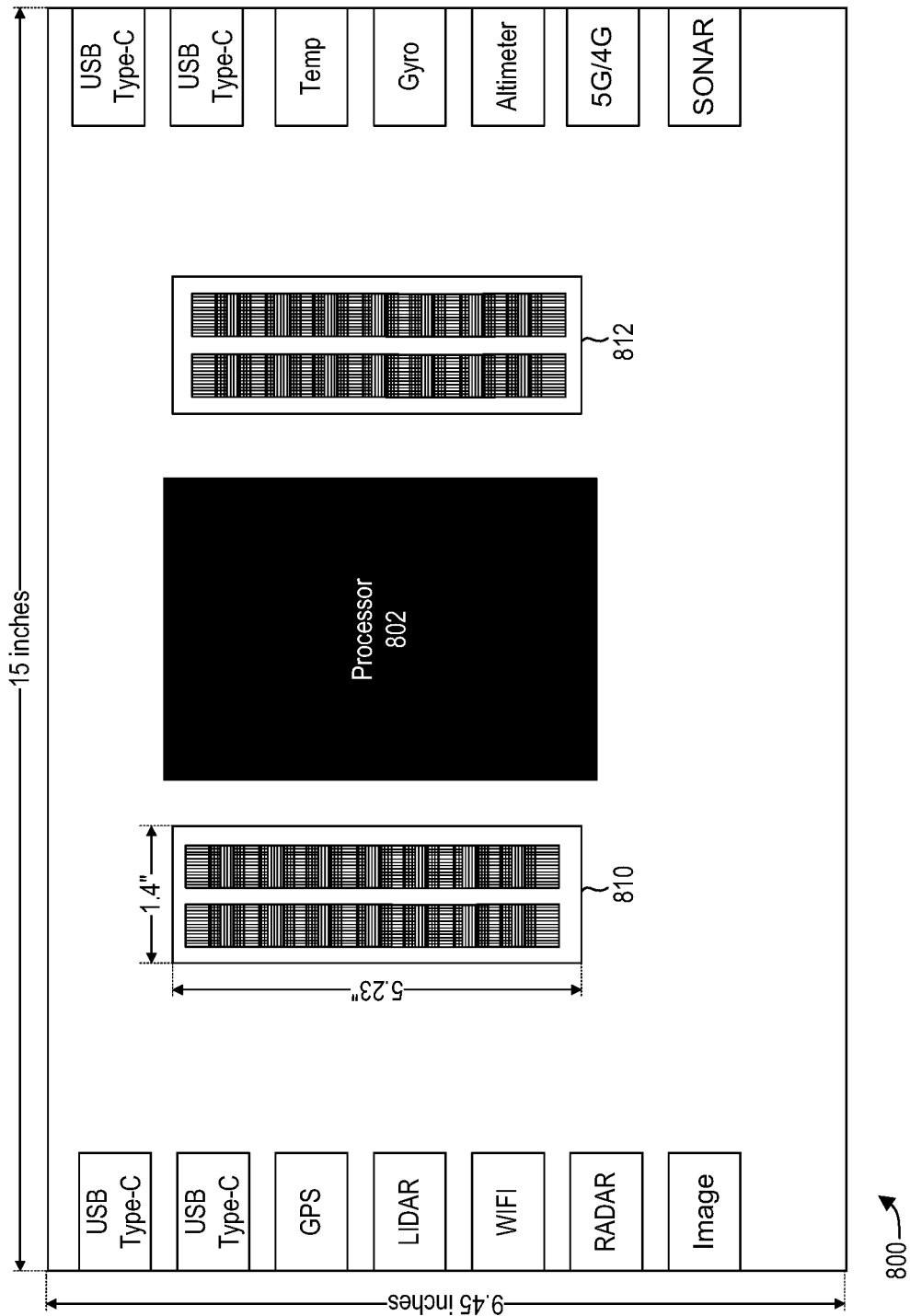
FIG. 8 illustrates a top-down perspective view of a PCB with a plurality of memory IC modules in the staggered configuration in accordance with some aspects of the disclosure.
Figure 9:
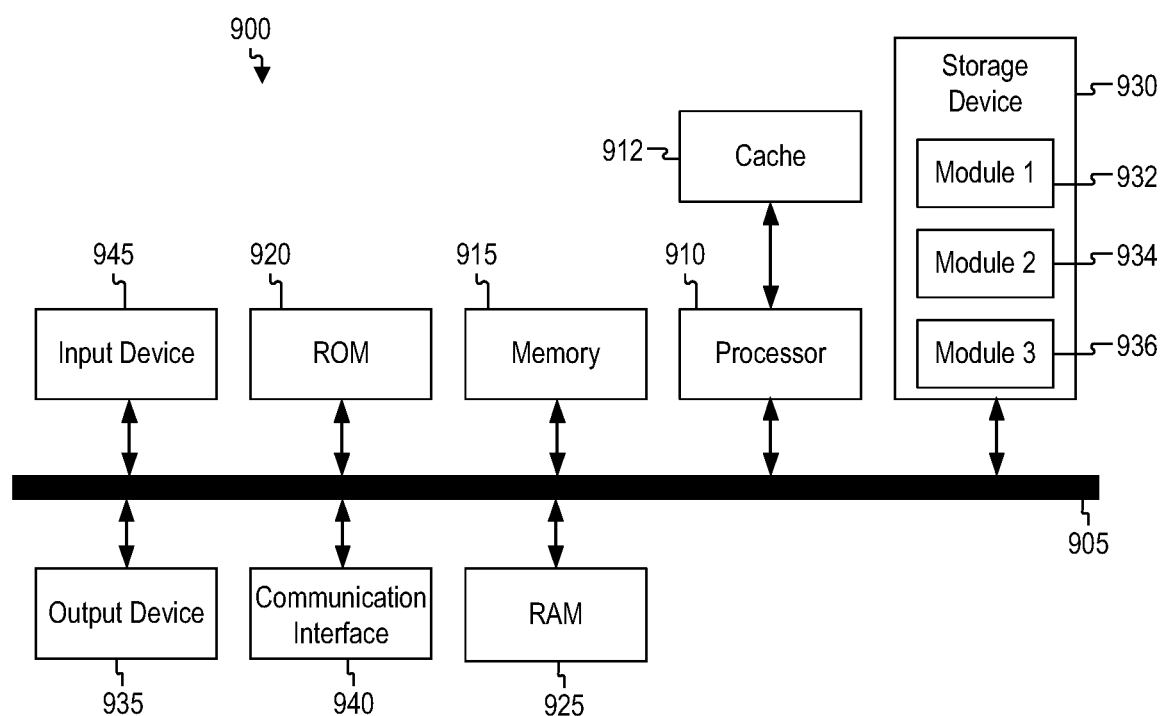
FIG. 9 illustrates an example of a computing system according to an example of the instant disclosure.

A description of an AV management system and a continual learning machine (CLM) for the AV management system, as illustrated in FIGS. 1 and 2, are first disclosed herein. FIGS. 3A and 3B illustrate examples of memory configurations and FIG. 3C illustrates an example of a PCB that uses a single rank memory configuration in AV Compute Module. FIG. 4 is a conceptual illustration that depicts memory IC staggering for single rank configuration and FIG. 5 is a cross-section of a PCB depicting memory IC staggering. FIG. 6 illustrates a top of electrical pads and vias of a PCB to implement staggered memory configurations disclosed herein. FIGS. 7A and 7B illustrate the placement of decoupling capacitors for the memory ICs and FIG. 8 illustrates an example of a PCB that implements the staggered memory stacking in a single rank configuration. FIG. 9 illustrates an example computing system that can be mounted to a PCB with the staggered memory configuration. The discussion then concludes with a brief description of example devices, as illustrated in FIG. 6. These variations shall be described herein as the various embodiments are set forth. The disclosure now turns to FIG. 1.

FIG. 1 illustrates an example of an AV management system 100. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measurement Units (IMUs), cameras (e.g., still image cameras, video cameras, etc.), light sensors (e.g., LIDAR systems, ambient light sensors, infrared sensors, etc.), RADAR systems, global positioning system (GPS) receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other embodiments may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some embodiments, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a prediction stack 116, a planning stack 118, a communications stack 120, a control stack 122, an AV operational database 124, and a high definition (HD) geospatial database 126, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 126, other components of the AV, and other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can also identify environmental uncertainties, such as where to look for moving objects, flag areas that may be obscured or blocked from view, and so forth. In some embodiments, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.). In some examples, the perception stack can also perceive environmental conditions of the AV 102 such as lighting and weather conditions to facilitate perception tasks and other tasks that consider the environmental conditions such as raining, snow, poor visibility in the human visibility spectrum, and the like.

The mapping and localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some embodiments, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources. In some examples, the mapping and localiza-tion stack 114 may also receive the environmental conditions associated with the AV 102 to facilitate the determination of the AV's position and orientation.

The prediction stack 116 can receive information from the localization stack 114 and objects identified by the perception stack 112 and predict a future path for the objects. In some embodiments, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

The planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

The control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

The communication stack 120 can transmit and receive signals between the various stacks and other components of the AV 102 and between the AV 102, the data center 150, the client computing device 170, and other remote systems. The communication stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 126 can store HD maps and related data of the streets upon which the AV 102 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

The AV operational database 124 can store raw AV data generated by the sensor systems 104-108, stacks 112-122, and other components of the AV 102 and/or data received by the AV 102 from remote systems (e.g., the data center 150, the client computing device 170, etc.). In some embodiments, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

The data center 150 can be a private cloud (e.g., an enterprise network, a co-location provider network, etc.), a public cloud (e.g., an IaaS network, a PaaS network, a SaaS network, or other CSP network), a hybrid cloud, a multi-cloud, and so forth. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, and a ridesharing platform 160, among other systems.

The data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, the cartography platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, the cartography platform 162, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from the cartography platform 162; modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 172. The client computing device 170 can be a customer's mobile computing device or a computing device integrated with the AV 102 (e.g., the local computing device 110). The ridesharing platform 160 can receive requests to pick up or drop off from the ridesharing application 172 and dispatch the AV 102 for the trip.

FIG. 2 illustrates an example diagram of a CLM 200 that solves uncommon scenarios in a rank-frequency distribution, which may be referred to long-tail prediction problem, in an AV in accordance with some examples. The CLM 200 is a continual loop that iterates and improves based on continual feedback to learn and resolve driving situations experienced by the AV.

The CLM 200 begins with a fleet of AVs that are outfitted with sensors to record a real-world driving scene. In some cases, the fleet of AVs is situated in a suitable environment that represents challenging and diverse situations such as an urban environment to provide more learning opportunities. The AVs record the driving situations into a collection of driving data 210.

The CLM 200 includes an error mining 220 to mine for errors and uses active learning to automatically identify error cases and scenarios having a significant difference between prediction and reality, which are added to a dataset of error instances 230. The error instances are long-tail scenarios that are uncommon and provide rich examples for simulation and training. The error instances 230 store high-value data and prevent storing datasets with situations that are easily resolved.

The CLM 200 also implements a labeling function 240 that includes both automated and manual data annotation of data that is stored in error augmented training data 250 and used for future prediction. The automated data annotation is performed by an ML labeling annotator that uses a neural network trained to identify and label error scenarios in the datasets. Using the ML labeling annotator enables significant scale, cost, and speed improvements that allow the CLM 200 to cover mores scenario of the long tail. The labeling function 240 also includes functionality to allow a human annotator to supplement the ML labeling function. By having both an automated ML labeling function and a manual (human) labeling annotator, the CLM 200 can be populated with dense and accurate datasets for prediction.

The final step of the CLM 200 is model training and evaluation 260. A new model (e.g., a neural network) is trained based on the error augmented training data 250 and the new model is tested extensively using various techniques to ensure that the new model exceeds the performance of the previous model and generalizes well to the nearly infinite variety of scenarios found in the various datasets. The model can also be simulated in a virtual environment and analyzed for performance. Once the new model has been accurately tested, the new model can be deployed in an AV to record driving data 210. The CLM 200 is a continual feedback loop that provides continued growth and learning to provide accurate models for an AV to implement.

In practice, the CLM can handle many uncommon scenarios, but the AV will occasionally need to account for new and infrequency scenarios that would be obvious to a human. For example, an AV may encounter another motorist making an abrupt and sometimes illegal U-turn. The U-turn can be at a busy intersection or could be mid-block, but the U-turn will be a sparse data point as compared to more common behaviors such as moving straight, left turns, right turns, and lane changes. Applying our CLM principles, an initial deployment model may not optimally predict U-turn situations and error situations commonly include U-turns. As the dataset grows and more error scenarios of U-turns are identified, the model can be trained to sufficiently predict a U-turn and allow the AV to accurately navigate this scenario.

The CLM 200 can be applied to any number of scenarios that a human will intuitively recognize including, for example, a K-turn (or a 3-point turn), lane obstructions, construction, pedestrians, animated objects, animals, emergency vehicles, funeral processions, jaywalking, and so forth. The CLM 200 provides a mechanism for continued learning to account for diverse scenarios that are present in the physical world.

FIG. 3A illustrates a cross-section of an example PCB 300 configured with memory ICs in a single rank configuration in accordance with some aspects. A processor 302 that is attached to the top surface of a PCB 300, with a plurality of memory ICs 304 that are securely mounted to (e.g., soldered) a single surface PCB 300. Each memory IC 304 is packaged into a rigid package (e.g., an epoxy mold) having a packaging interface such as a BGA, which includes a two-dimensional grid of pins on the bottom surface of the memory IC 304. FIG. 3A illustrates a typical one channel single rank configuration with memory ICs 304 being placed only one side of the PCB 300, and each memory IC 304 includes a chip select (CS) pin that is electrically coupled to a single pin of the processor via CS0 line 308. The channel address/command signals are coupled to memory ICs 304 each memory chip in fly-by topology by line 310 and terminated to Vtt through Vtt resistors.

FIG. 3B illustrates another cross-section of an example PCB 320 configured with memory ICs in a dual rank configuration in accordance with some aspects. In this example, the processor 302 is mounted to a top surface, memory ICs 304 are mounted on at top side of the PCB 320, and memory ICs 305 are mounted to a bottom side of the PCB 320. In the dual rank configuration, opposing memory ICs 304 and 305 share the same address and command signals and separately controlled accessed by the CPU with chip select signals. For example, as illustrated in 3B, a CS pin of the memory ICs 304 are electrically coupled to a pin of the processor 302 via CS1 line 312 and a CS pin of the memory ICs 305 are coupled to a different pin of the processor via a CS2 line 314. A memory IC 304 disposed on the top surface may be coupled to inverted addresses of a memory IC 305 on the bottom surface. For example, address A0 of the memory IC 304 on the top surface may be connected to address A1 of the memory IC 305 on the bottom surface, address A1 of the memory IC 305 on the top surface may be connected to address A0 of the memory IC 304 on the bottom surface, and so forth. The top and bottom ranks are separately accessed with chip select CS0 and chip select CS1. While the configuration saves PCB real estate to double the memory size than that of a single rank configuration, this configuration reduces memory bandwidth. For a given memory size (for example: 128 GB=32 GB×4 channel) a dual rank configuration needs only half the channels (128 GB=16 GB×8 channel). The drawback for using the dual rank will halve the bandwidth since the number of available channels is halved for a given memory size. Reducing the memory bandwidth may adversely impact the ability to efficiently transfer large volumes of data, such as a 3D point cloud, into the processor 302 to facilitate AV navigation.

FIG. 3C illustrates a top view of a PCB 350 with a processor 302 that is connected to memory ICs that are located in a memory zone 352 and memory zone 354. The PCB 350 can include a number of connectors, sensors, and other peripheral devices associated with various aspects of the AV. The PCB 350 includes four USB Type-C connectors (e.g., data transfer, calibration, diagnostics, etc.), a GPS sensor that connects with an antenna, a LIDAR sensor, a Wi-Fi communication module that also connects to an antenna, a RADAR system that is external to the PCB 350 (e.g., attached to the AV), one or more image sensors attached to the AV, a temperature sensor, a gyro sensor, an altimeter, a wireless communication system module (e.g., 5G, LTE, etc.), and an acoustic sensor such as a SONAR system.

In some aspects, to accommodate the electrical lines that connect the various sensors, modules, and components of the AV to the processor 302, the PCB 350 should have a routable area 356 that allows electrical lines to be etched into the PCB 350. Because the illustrative example includes 64 memory ICs, the memory ICs are configured into a grid of 4×8 memory ICs. Each of the memory zone 352 and the memory zone 354 consumes 4.84 inches of longitudinal space on the PCB 350 and 3.06 inches of lateral space on the PCB 350. In this illustrative example, the memory ICs cannot be configured into a single row or a dual row because the consumed PCB real estate would limit the routable area 356 at the edges of the memory zone 352 and memory zone 354 to be too small to handle the number of electrical lines for connecting the various sensors and connectors to the processor 302. In addition, the PCB 350 may have a clearance space 358 requirement where electrical lines cannot be routed due to manufacturing limitations for etching and machine requirements to handle the PCB 350.

In this illustrative example, the PCB 350 is 15 inches wide and 9.45 inches long. Other PCBs can be used, but PCBs that exceed the size of the PCB 350 become cost-prohibitive to manufacture. In addition, multilayer PCBs with internal electrical lines etched between the layers (e.g., instead of voltage or ground references) may not be cost-effective unless produced in massive quantities.

FIG. 4 illustrates a conceptual diagram of pin connections of a memory IC that is packaged in a BGA package in accordance with some aspects of the disclosure. A first memory IC 402 is fixed to a first surface and a second memory IC 404 is coupled to a second, opposing surface of the PCB. In this case, the second memory IC 404 is rotated about the horizontal axis and has inverted columns (e.g., rotated along a column). An edge pin column 406 on a lateral edge of the first memory IC 402 may partially or entirely correspond to an opposing edge pin column 408 on a lateral edge of the second memory IC 404.

In some aspects, the pin column (or rows, depending on the orientation of the IC) of memory IC 402 in a BGA package may correspond to the column on an opposing side of the memory IC 404. For example, the edge pin column 406 and the opposing edge pin column 408 include power input, voltage references, reset, calibration, and other common functions. Because the lateral edge pin column 406 receives multiple reference voltages that are common to each memory IC (e.g., $V_{SS}$, $V_{DDQ}$, $V_{SSQ}$, $V_{SS}$, $V_{DD}$, $V_{SSQ}$, $V_{PP}$, etc.), these pins on different ICs can be coupled. The IC may also include accessory pins, which can be used testing, calibration, or other general purpose inputs. An accessory pin does not include specific, unique pins necessary for memory operation, such as addressing and data pins. Examples of an accessory pin include a zero quiescent (ZQ) calibration pin 410, a test enable pin 412 (e.g., TEN/NF), and an alert pin 414.

As illustrated in FIG. 4, the memory IC 404 on the opposing surface has an opposing edge pin column 408 that corresponds to the lateral edge pin column 406. In this case, the common pins (e.g., $V_{SS}$, $V_{DDQ}$, $V_{SSQ}$, $V_{SS}$, $V_{DD}$, $V_{SSQ}$, $V_{PP}$, etc.) can be coupled together using a via or other suitable electrical structure. Accessory pins such as the ZQ calibration pin 410 can be electrically isolated if not necessary for operation of the memory IC in production (e.g., in an AV). As illustrated in FIG. 4, ten different electrical pins can be coupled together using a via and the lateral edge pin column 406 of memory IC 402 can be positioned directly over the opposing edge pin column 408 of the memory IC 404. In some aspects, the accessory pins (e.g., ZQ calibration pin 410, test enable pin 412, and alert pin 414) may be suitable for testing, calibration, and other accessory purposes and may not be coupled to other memory ICs. In some cases, the accessory pins may only be needed for development and testing and electrical connection can be omitted in production circuits.

As further illustrated in FIG. 4, the addressing pins (e.g., A pins) and the data input/output pins (DQ pins) are not directly coupled and allow the memory IC 402 and the memory IC 404 to be arranged in a single rank configuration.

FIG. 5 illustrates a cross-section of a PCB 500 including a plurality of memory ICs 502 on opposing surfaces in a staggered configuration in accordance with some aspects of the disclosure. The memory ICs 502 include at least one column of pins that are staggered to overlap at least one column of pins of a memory IC 502 on an opposing surface of the PCB 500. As illustrated in FIG. 4, at least one pin in the overlapping column of pins can be electrically connected to the memory IC 502 on the opposing surface.

By staggering the memory ICs 502 on opposing surfaces, the real estate consumed by the memory ICs 502 can be reduced. In this case, the amount of space saved by staggering opposing memory ICs 502 is based on a bevel 504 (or a gutter) of the memory IC 502 and the width of each column of pins 506 that overlap. In one aspect, the bevel 504 of the memory IC 502 and the width of column of pins 506 that overlap is 2.6 mm, and the real estate consumption of the memory ICs 502 can be reduced 28% (2.6 mm/9 mm) in a single direction (e.g., longitudinal or lateral).

In other aspects, the amount of space saved can also include a tolerance around each memory IC 502 to allow production equipment to adequately place the memory ICs 502 on the PCB 500 without interfering with the positions of nearby devices, components, and ICs. As illustrated in FIG. 3C, the pitch between each memory IC is based on the dimensions (e.g., 9 mm×11 mm) of each memory IC plus a boundary region. As illustrated in FIG. 5, the pitch between a memory IC 502 on the top surface of the PCB 500 and a memory IC 502 on the bottom surface of the PCB 500 is 6.4 mm (e.g., 9 mm less the 2.6 mm in directional space saving).

In some aspects, the PCB 500 may also be configured to have voltage reference plane 510 for memory ICs 502 disposed on a top surface of the PCB 500 and a voltage reference plane 512 for memory ICs 502 disposed on a bottom surface of the PCB 500. For example, the top VDD/VDDQ power plane 510 can power the top placed memory chips and the bottom VDD/VDDQ power plane 512 can power the bottom placed memory chips for better current sharing.

FIG. 6 is a conceptual diagram illustrating electrical pads on a top surface and a bottom surface of a PCB for electrically and mechanically coupling the memory IC to the PCB in accordance with some aspects of the disclosure. As illustrated in FIG. 6, top surface electrical pads 602 on the PCB are staggered with respect to bottom surface electrical pads 604. The column 606 is the overlapped column pins that mainly fixed voltage references (e.g., power and ground pins) of 602 and 604 that, as noted above, are generally fixed voltage references (e.g., power, ground, etc.) and both bottom and top pins can be shared with single vias 608. In some cases, specific pins such as the ZQ calibration pan and the test enable (TEN) pin on the top surface and the bottom have separate vias and are electrically isolated.

FIG. 7A illustrates a cross-section of a PCB 700 with the staggered memory ICs 702 and positioning of decoupling capacitors 706 in accordance with some aspects of the disclosure. The decoupling capacitors are recommended to be placed adjacent to the edges of the memory IC, which consumes additional real estate. In the staggered configuration illustrated in FIG. 7A, the decoupling capacitors for 702 can be placed opposite to mid-region of 703 and can be connected through a plane 704.

FIG. 7B illustrates a top-down perspective view of the PCB 700 with a memory IC 702 located on an opposing surface with respect to the capacitors 706 in accordance with some aspects of the disclosure. As illustrated in FIG. 7B, the capacitors can be mounted in proximity to the corresponding IC pins of the memory IC, thereby reducing electrical lines and further improving decoupling performance.

FIG. 8 illustrates a top-down perspective view of a PCB 800 with a plurality of memory IC modules in the staggered configuration in accordance with some aspects of the disclosure. As illustrated in FIG. 8, a processor 802 is positioned approximately in the center of the PCB 800 and includes memory zone 810 and memory zone 812. Memory ICs are staggered in an overlapping manner so that a column of pins of the memory IC on a top surface overlaps a corresponding column of pins of the memory IC on a bottom surface. As noted above, this results in significant savings in PCB real estate and provides greater flexibility for the circuit design to maximize different parameters and reduce parasitica. For example, greater flexibility in circuit design can improve electrical and thermal performance. In this instance, the memory zone 810 and 812 each consumes 1.4 inches of width and 5.23 inches of length, or 14.64 $in^2$ of total PCB real estate. The example illustrated in FIG. 3C, the memory zones consumed 29.6 $in^2$ of total PCB real estate.

FIG. 9 shows an example of computing system 900, which can be for example any computing device for training or executing a neural network, or any component thereof in which the components of the system are in communication with each other using connection 905. Connection 905 can be a physical connection via a bus, or a direct connection into processor 910, such as in a chipset architecture. Connection 905 can also be a virtual connection, networked connection, or logical connection.

In some embodiments, computing system 900 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example computing system 900 includes at least one processing unit (a central processing unit (CPU) or processor) 910 and connection 905 that couples various system components including system memory 915, such as read-only memory (ROM) 920 and random access memory (RAM) 925 to processor 910. Computing system 900 can include a cache of high-speed memory 912 connected directly with, in close proximity to, or integrated as part of processor 910.

Processor 910 can include any general purpose processor and a hardware service or software service, such as services 932, 934, and 936 stored in storage device 930, configured to control processor 910 as well as a special-purpose processor where software instructions are incorporated into the actual processor design. Processor 910 may essentially be a completely self-contained computing system, containing multiple cores or processors, a bus, memory controller, cache, etc. A multi-core processor may be symmetric or asymmetric.

To enable user interaction, computing system 900 includes an input device 945, which can represent any number of input mechanisms, such as a microphone for speech, a touch-sensitive screen for gesture or graphical input, keyboard, mouse, motion input, speech, etc. Computing system 900 can also include output device 935, which can be one or more of a number of output mechanisms known to those of skill in the art. In some instances, multimodal systems can enable a user to provide multiple types of input/output to communicate with computing system 900. Computing system 900 can include communications interface 940, which can generally govern and manage the user input and system output. There is no restriction on operating on any particular hardware arrangement, and therefore the basic features here may easily be substituted for improved hardware or firmware arrangements as they are developed.

Storage device 930 can be a non-volatile memory device and can be a hard disk or other types of computer readable media which can store data that are accessible by a computer, such as magnetic cassettes, flash memory cards, solid state memory devices, digital versatile disks, cartridges, RAMs, ROM, and/or some combination of these devices.

The storage device 930 can include software services, servers, services, etc., that when the code that defines such software is executed by the processor 910, it causes the system to perform a function. In some embodiments, a hardware service that performs a particular function can include the software component stored in a computer-readable medium in connection with the necessary hardware components, such as processor 910, connection 905, output device 935, etc., to carry out the function.

The computing system 900 can also include a graphical processing unit (GPU) array 950 or any similar processor for performing massively complex and parallel mathematical operations such as simulations, games, neural network training, and so forth. The GPU array 950 includes at least one GPU and is illustrated to have three GPUs comprising GPU 952, GPU 954, and GPU 956. However, the GPU array 950 can be any number of GPUs. In some examples, the GPU core can be integrated into a die of the processor 910.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Illustrative examples of the disclosure include:

Aspect 1. An autonomous vehicle (AV), comprising: an electronic drivetrain configured to move the AV; and an autonomous driver system controller (ADSC) fixed to an interior surface of the AV and configured to control the electronic drivetrain with a processor connected to a plurality of memory integrated circuits (ICs) that are fixed to a printed circuit board (PCB), wherein the plurality of memory ICs are mounted on each side of the PCB using a ball grid array (BGA) with a column of pins in the BGA of a top-surface memory IC is longitudinally aligned with a corresponding column of pins in the BGA of a bottom-surface memory IC.

Aspect 2. The AV of Aspect 1, wherein each memory IC of the plurality of memory ICs receives a an addressing input for single rank operation.

Aspect 3. The AV of any of Aspects 1 to 2, wherein a column of pins in the BGA of the top-surface memory IC is not longitudinally aligned with a corresponding column of pins in the BGA of the bottom-surface memory IC.

Aspect 4. The AV of any of Aspects 1 to 3, wherein a memory IC overlaps two different memory ICs on an opposing surface.

Aspect 5. The AV of any of Aspects 1 to 4, wherein a portion of pins in the column of pins in the BGA of the top-surface memory IC are electrically coupled to corresponding pins in the corresponding column of pins in the BGA of the bottom-surface memory IC.

Aspect 6. The AV of any of Aspects 1 to 5, wherein the portion of pins in the column of pins in the BGA of the top-surface memory IC are electrically coupled to corresponding pins in the corresponding column of pins in the BGA of the bottom-surface memory IC comprise voltage lines and a ground connection common to each memory IC in the plurality of memory ICs, wherein at least one unconnected pin in the column of pins in the BGA of the top-surface memory IC is not connected to the bottom-surface memory IC.

Aspect 7. The AV of any of Aspects 1 to 6, wherein the at least one unconnected pin comprises one of an alert pin, a test enable pin, a ZQ calibration pin for input and output impedance calibration, a voltage reference calibration pin, and a reset pin.

Aspect 8. The AV of any of Aspects 1 to 7, wherein a memory IC of the plurality of memory ICs is coupled to at least one decoupling capacitor that is laterally adjacent to the memory IC, wherein the at least one decoupling capacitor is positioned over addressing pins over a memory IC disposed on the opposing surface.

Aspect 9. The AV of any of Aspects 1 to 8, wherein a chip select pin of each memory IC on both sides of the PCB of the plurality of memory ICs is electrically coupled to a single pin on the processor.

Aspect 10. The AV of any of Aspects 1 to 9, wherein the PCB includes a first voltage plane for memory ICs on a top surface of the PCB and a second voltage plane for memory ICs on a bottom surface of the PCB.

Aspect 11. A printed circuit board (PCB), comprising: A processor coupled to the PCB; and a plurality of memory integrated circuits (ICs) that are mounted to a top surface of the PCB and a bottom surface of the PCB, wherein the plurality of memory ICs are mounted on each side of the PCB using a ball grid array (BGA) with a column of pins in the BGA of a top-surface memory IC is longitudinally aligned with a corresponding column of pins in the BGA of a bottom-surface memory IC.

Aspect 12. The PCB of Aspect 11, wherein each memory IC of the plurality of memory ICs receives an addressing input for single rank operation.

Aspect 13. The PCB of any of Aspects 11 to 12, wherein a column of pins in the BGA of the top-surface memory IC is not longitudinally aligned with a corresponding column of pins in the BGA of the bottom-surface memory IC.

Aspect 14. The PCB of any of Aspects 11 to 13, wherein a memory IC overlaps two different memory ICs on an opposing surface.

Aspect 15. The PCB of any of Aspects 11 to 14, wherein a portion of pins in the column of pins in the BGA of the top-surface memory IC are electrically coupled to corresponding pins in the corresponding column of pins in the BGA of the bottom-surface memory IC.

Aspect 16. The PCB of any of Aspects 11 to 15, wherein the portion of pins in the column of pins in the BGA of the top-surface memory IC are electrically coupled to corresponding pins in the corresponding column of pins in the BGA of the bottom-surface memory IC comprise voltage lines and a ground connection common to each memory IC in the plurality of memory ICs, wherein at least one unconnected pin in the column of pins in the BGA of the top-surface memory IC is not connected to the bottom-surface memory IC.

Aspect 17. The PCB of any of Aspects 11 to 16, wherein the at least one unconnected pin comprises one of an alert pin, a test enable pin, a ZQ calibration pin for input and output impedance calibration, a voltage reference calibration pin, and a reset pin.

Aspect 18. The PCB of any of Aspects 11 to 17, wherein a memory IC of the plurality of memory ICs is coupled to at least one decoupling capacitor that is laterally adjacent to the memory IC, wherein the at least one decoupling capacitor is positioned over addressing pins over a memory IC disposed on the opposing surface.

Aspect 19. The PCB of any of Aspects 11 to 18, wherein a chip select pin of each memory IC on both sides of the PCB of the plurality of memory ICs is electrically coupled to a single pin on the processor.

Aspect 20. The PCB of any of Aspects 11 to 19, wherein the PCB includes a first voltage plane for memory ICs on a top surface of the PCB and a second voltage plane for memory ICs on a bottom surface of the PCB.

What is claimed is:

1. An autonomous vehicle (AV), comprising:
an electronic drivetrain configured to move the AV; and
an autonomous driver system controller (ADSC) fixed to an interior surface of the AV and configured to control the electronic drivetrain with a processor connected to a plurality of memory integrated circuits (ICs) that are fixed to a printed circuit board (PCB),
wherein the plurality of memory ICs are mounted on each side of the PCB using a ball grid array (BGA) with a column of pins in the BGA of a top-surface memory IC is longitudinally aligned with a corresponding column of pins in the BGA of a bottom-surface memory IC,
wherein each memory IC of the plurality of memory ICs receives an addressing input for single rank operation,
wherein a column of pins in the BGA of the top-surface memory IC is not longitudinally aligned with a corresponding column of pins in the BGA of the bottom-surface memory IC,
wherein a memory IC overlaps two different memory ICs on an opposing surface,
wherein a portion of pins in the column of pins in the BGA of the top-surface memory IC are electrically coupled to corresponding pins in the corresponding column of pins in the BGA of the bottom-surface memory IC,
wherein the portion of pins in the column of pins in the BGA of the top-surface memory IC are electrically coupled to corresponding pins in the corresponding column of pins in the BGA of the bottom-surface memory IC comprise voltage lines and a ground connection common to each memory IC in the plurality of memory ICs, wherein at least one unconnected pin in the column of pins in the BGA of the top-surface memory IC is not connected to the bottom-surface memory IC,
wherein the at least one unconnected pin comprises one of an alert pin, a test enable pin, a ZQ calibration pin for input and output impedance calibration, a voltage reference calibration pin, and a reset pin,
wherein a memory IC of the plurality of memory ICs is coupled to at least one decoupling capacitor that is laterally adjacent to the memory IC, wherein the at least one decoupling capacitor is positioned over addressing pins over a memory IC disposed on the opposing surface, and
wherein the PCB includes a first voltage plane for memory ICs on a top surface of the PCB and a second voltage plane for memory ICs on a bottom surface of the PCB.

2. A printed circuit board (PCB), comprising:
a processor coupled to the PCB; and
a plurality of memory integrated circuits (ICs) that are mounted to a top surface of the PCB and a bottom surface of the PCB,
wherein the plurality of memory ICs are mounted on each side of the PCB using a ball grid array (BGA) with a column of pins in the BGA of a top-surface memory IC is longitudinally aligned with a corresponding column of pins in the BGA of a bottom-surface memory IC
wherein each memory IC of the plurality of memory ICs receives an addressing input for single rank operation,
wherein a column of pins in the BGA of the top-surface memory IC is not longitudinally aligned with a corresponding column of pins in the BGA of the bottom-surface memory IC,
wherein a memory IC overlaps two different memory ICs on an opposing surface,
wherein a portion of pins in the column of pins in the BGA of the top-surface memory IC are electrically coupled to corresponding pins in the corresponding column of pins in the BGA of the bottom-surface memory IC,
wherein the portion of pins in the column of pins in the BGA of the top-surface memory IC are electrically coupled to corresponding pins in the corresponding column of pins in the BGA of the bottom-surface memory IC comprise voltage lines and a ground connection common to each memory IC in the plurality of memory ICs, wherein at least one unconnected pin in the column of pins in the BGA of the top-surface memory IC is not connected to the bottom-surface memory IC,
wherein the at least one unconnected pin comprises one of an alert pin, a test enable pin, a ZQ calibration pin for input and output impedance calibration, a voltage reference calibration pin, and a reset pin,
wherein a memory IC of the plurality of memory ICs is coupled to at least one decoupling capacitor that is laterally adjacent to the memory IC, wherein the at least one decoupling capacitor is positioned over addressing pins over a memory IC disposed on the opposing surface,
wherein a chip select pin of each memory IC on both sides of the PCB of the plurality of memory ICs is electrically coupled to a single pin on the processor, and
wherein the PCB includes a first voltage plane for memory ICs on a top surface of the PCB and a second voltage plane for memory ICs on a bottom surface of the PCB.

* * * * *